(12) United States Patent
King, Jr. et al.

(10) Patent No.: US 7,742,308 B1
(45) Date of Patent: Jun. 22, 2010

(54) INCREASED DRIVE DENSITY STORAGE SYSTEM HAVING FULL SERVICEABILITY

(75) Inventors: Joseph P. King, Jr., Sterling, MA (US); William J. DePatie, Jr., Hopkinton, MA (US); Albert F. Beinor, Sutton, MA (US); W. Brian Cunningham, Westborough, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 12/164,198

(22) Filed: Jun. 30, 2008

(51) Int. Cl.
*H05K 7/16* (2006.01)
*H05K 7/00* (2006.01)
*A47B 81/06* (2006.01)
*A47F 7/00* (2006.01)

(52) U.S. Cl. .................. 361/727; 361/679.39; 312/9.43; 211/26

(58) Field of Classification Search .................. 361/679.01–679.45, 724–727, 679.55–679.59; 312/223.1, 223.2, 9.3, 9.41–9.44, 334.1, 312/334.5, 273, 298; 211/26; 360/97.01–99.12
See application file for complete search history.

(56) References Cited

U.S. PATENT DOCUMENTS

| | | | | |
|---|---|---|---|---|
| 6,611,424 B2 * | 8/2003 | Huang | .................. | 361/679.39 |
| 7,104,618 B2 * | 9/2006 | Chaloner et al. | ........... | 312/9.43 |
| 2007/0109744 A1 * | 5/2007 | Matsushima et al. | ........ | 361/695 |

* cited by examiner

*Primary Examiner*—Jayprakash N Gandhi
*Assistant Examiner*—Nidhi Desai
(74) *Attorney, Agent, or Firm*—Krishnendu Gupta; Scott A. Ouellette

(57) ABSTRACT

An electronic component housing system includes a cabinet having a front portion and a rear portion; a sliding mechanism mounted within the cabinet; and first and second electronic devices mounted to the sliding mechanism, the first and second electronic devices each having a front end and a back end. The sliding mechanism, in a first mode, enables the first and second electronic devices mounted thereto to be positioned within the cabinet between the front portion and the rear portion thereof, such that the front end of the first electronic device is disposed proximate the front portion of the cabinet and the back end of the second electronic device is disposed proximate the rear portion of the cabinet. The sliding mechanism, in a second mode, enables the first electronic device to be positioned beyond the front portion of the cabinet and the second electronic device to be positioned in a location substantially similar to the position occupied by the first electronic device in the first mode.

9 Claims, 6 Drawing Sheets

INCREASED DRIVE DENSITY STORAGE SYSTEM HAVING FULL SERVICEABILITY

FIELD OF THE INVENTION

A system having increased component capacity while maintaining full serviceability is disclosed and, more particularly, a storage system having increased drive density while maintaining full serviceability of the drives and electronics associated therewith.

BACKGROUND

Large-scale storage systems typically include one or more cabinets housing a number of disk array enclosures, power supplies and electronics to enable the communication of data between a host and the disk drives in the disk array enclosures. In such systems, each disk array enclosure ("DAE"), which houses a number of disk drives, is mounted within the cabinet to enable access to the disk drives of the enclosure from the front of the cabinet and access to components such as power supplies of the enclosure from the rear of the cabinet. The DAEs are mounted within the cabinet in a stacked configuration, which enables a large number of disk drives to be included in each cabinet. Each DAE also includes a number of fans for directing air into the front of the cabinet, through the DAE and out through the rear of the cabinet. This facilitates so-called "hot aisle-cold aisle" cooling, where the cabinets in a data center are positioned such that air is drawn into the cabinets from a "cold aisle" of the data center and exhausted to a "hot aisle" of the data center.

SUMMARY

A storage system having increased drive density is disclosed, which also provides full access to all of the drives, fans and power supplies of each DAE and allows for hot aisle-cold aisle cooling. The system includes a sliding mount system that enables two DAEs to be mounted in substantially the same space that a single DAE was mounted in the prior art system (double-density). The pair of DAEs is mounted within the cabinet via a sliding assembly that allows the DAEs to be mounted in relatively close proximity to each other when the DAEs are in operation within the cabinet and enables the DAEs to be slid out from the cabinet in a manner that provides additional access space to facilitate service access to the disk drives, fans and power supplies of both DAEs. Since the DAEs are mounted within the cabinet in a common orientation, the fans in each DAE are oriented to direct air into the front of the cabinet, through the DAEs and out through the rear of the cabinet, thus facilitating hot aisle-cold-aisle cooling. Further, given the common orientation of the DAEs, all cabling of the system is able to be directed to the rear of the cabinet.

BRIEF DESCRIPTION OF THE DRAWINGS

These and other features will become more readily apparent from the following detailed description when read together with the accompanying drawings, in which.

DETAILED DESCRIPTION

Figure 1:
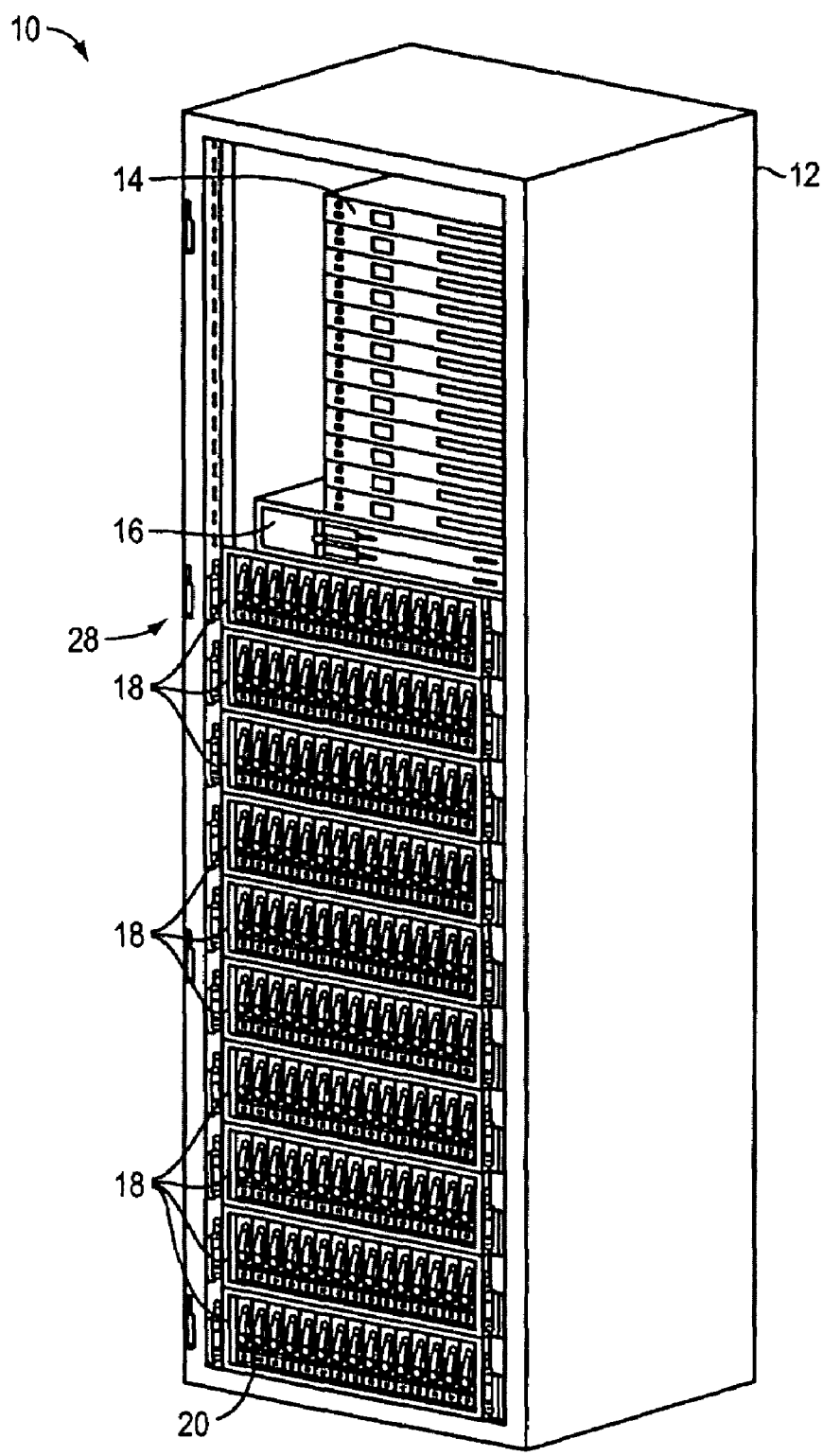
FIG. 1 is a front perspective view of the data storage system.
Figure 2:
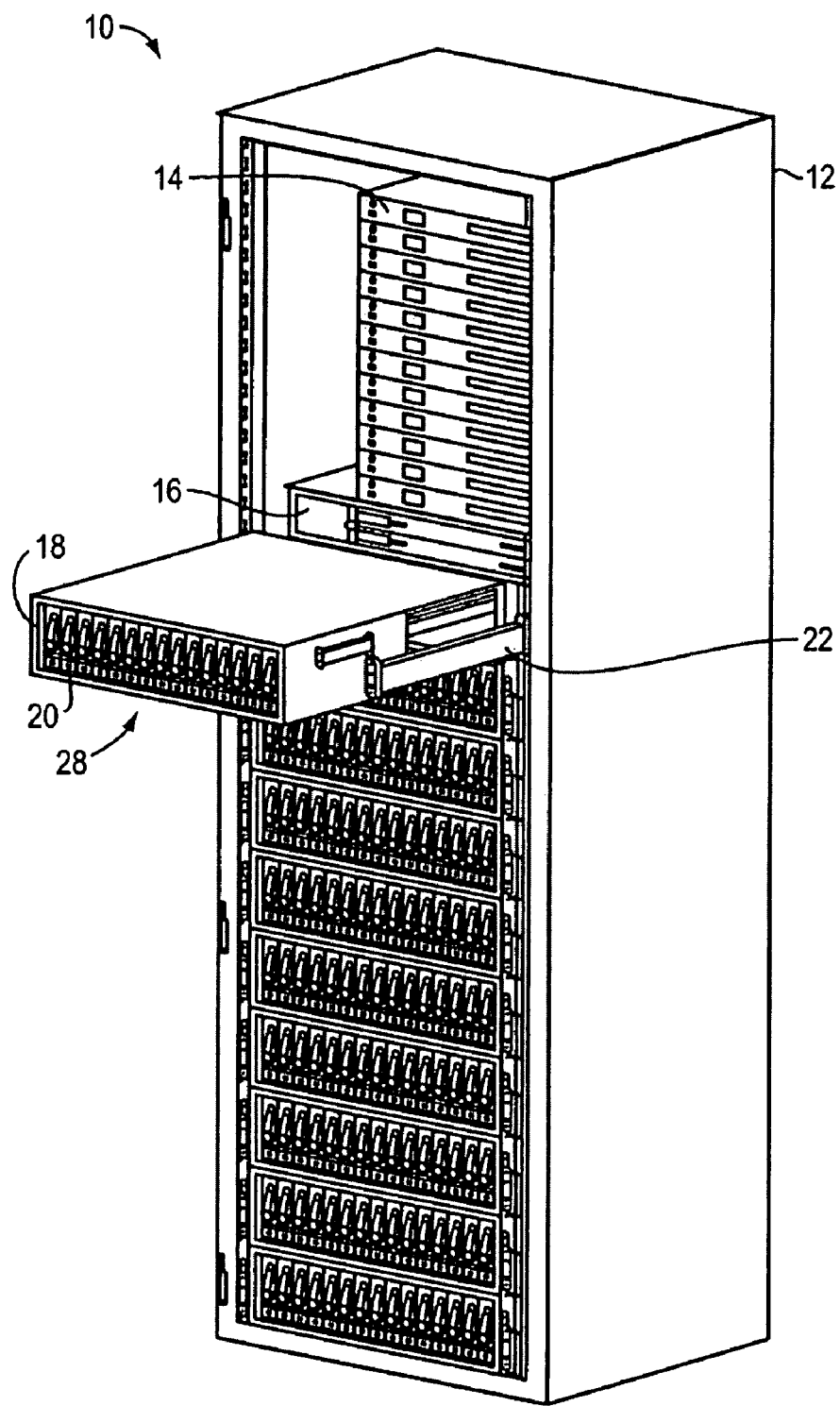
FIG. 2 is a front perspective view of the data storage system showing a sliding assembly in the open position.

FIG. 1 is a front perspective view of a data storage system 10, which includes a cabinet 12 housing a number of components. Housed within cabinet 12 are a number of servers 14, a number of switches 16 and a number of sliding assemblies 28, FIGS. 3A-3C. Each sliding assembly 28 includes a pair of disk array enclosures (DAEs) 18, each of which including a number of disk drives 20 mounted in a front portion of the DAE 18 and a number of cooling devices 24, FIG. 4, and power supplies 26, FIG. 4, mounted in a rear portion of the DAE 18. Sliding assembly 28 also includes a pair of sliders 22 which are mounted to each DAE in the sliding assembly and to the cabinet 12, to mount the DAEs 18 within the cabinet 12. Sliding assemblies 28 allow the DAEs 18 to be mounted in relatively close proximity to each other when the DAEs 18 are in operation within the cabinet 12 and enable the DAEs 18 to be positioned in a manner that facilitates service access to the disk drives 20, cooling devices 24 and power supplies 26 of both DAEs 18. FIG. 2 is a front perspective view of the system 10 showing one of the sliding assemblies 28 slid out from the cabinet 12. Sliding assemblies 28 are described in greater detail below with reference to FIGS. 3A-3C.

Figure 3A:
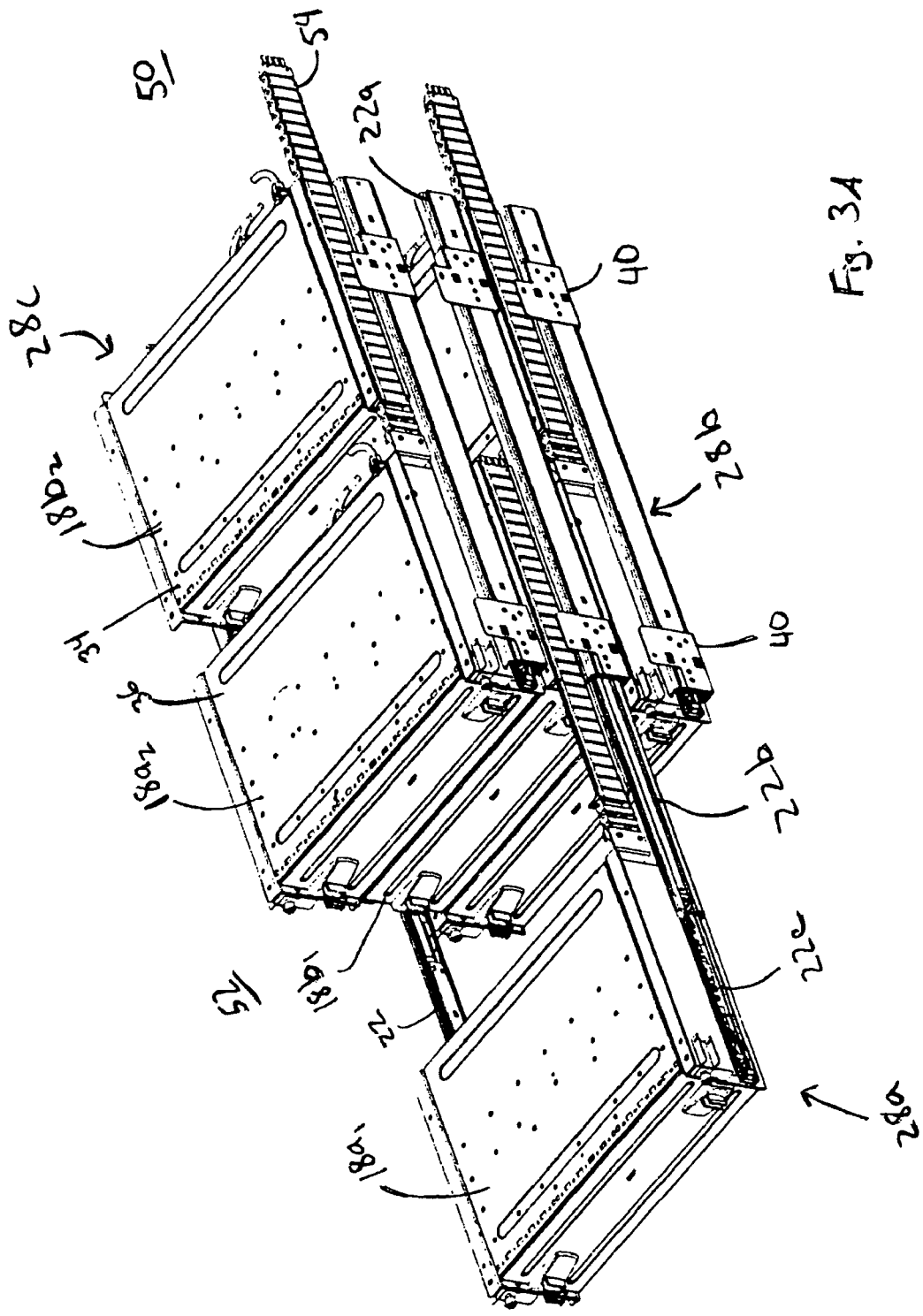
FIGS. 3A-3C are diagrams of several sliding assemblies of the storage system showing a sliding assembly in the open position.
Figure 3B:
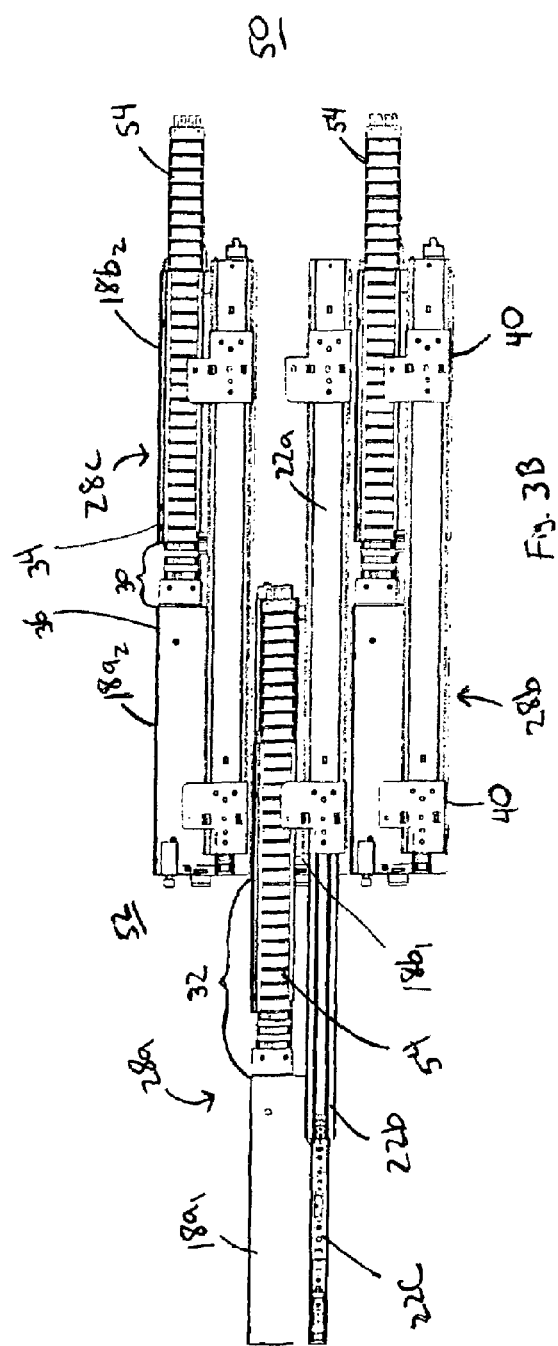
Figure 3C:
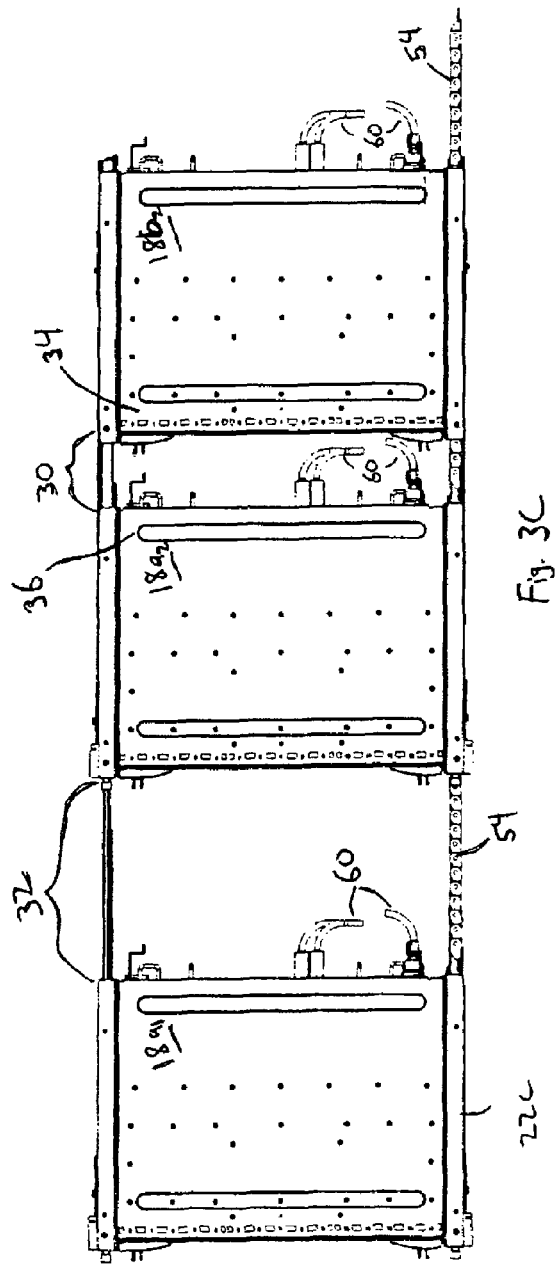

FIGS. 3A-3C show three sliding assemblies 28a, 28b and 28c outside of the cabinet 12. This is solely for the purpose of describing the configuration and function of the sliding assemblies. For simplicity, drives 20 are not shown in DAEs 18. The cabinet 12 can house many more than three sliding assemblies, for example, cabinet 12 in FIGS. 1 and 2 houses 10 assemblies 28. It will be understood that the number of assemblies 28 housed in a cabinet depends on available physical space and data storage requirements, and is not an essential feature of the system.

As shown in FIGS. 3A-3C, each sliding assembly 28 includes a front DAE 18a and a rear DAE 18b. Each DAE 18 is mounted to a sliding mechanism including a pair of sliders 22, which includes brackets 40 for mounting the sliding assemblies into the cabinet 12. Each pair of sliders 22 is constructed of a first slide rail 22a, to which brackets 40 are mounted, a second slide rail 22b which is slidably mounted within slide rail 22a, and a third slide rail 22c, which is slidably mounted within slide rail 22b. Slide rails 22b and 22c are preferably slidably mounted within slide rails 22a and 22b, respectively, through the use of a ball bearing configuration, which enables each slide rail to slide within the slide rail into which it is mounted. It will be understood that any type of sliding configuration may be utilized to slidably mount each slide rail as described above, such as static bushings and the like. As described in detail below, the sliders 22 enable the sliding assembly 28 to be pulled out from the cabinet in a manner similar to pulling a drawer from a cabinet.

The rear DAE 18b in a sliding assembly 28 is mounted to second slide rail 22b and the front DAE 18a in a sliding assembly 28 is mounted to third slide rail 22c. For example, as shown in FIG. 3A, front DAE $18a_1$ of sliding assembly 28a is mounted to slide rail 22c and rear DAE $18b_1$ of sliding assembly 28a is mounted to slide rail 22b.

When the sliding assembly 28 is in its first, operational position, as shown by assemblies 28b and 28c in FIGS. 3A and 3B, both DAEs 18 of each sliding assembly are housed within cabinet 12, as shown in FIG. 1. A top view of the sliding assemblies is shown in FIG. 3C, which shows that sliding assembly 28c includes a front DAE 18a$_2$ and a rear DAE 18b$_2$. FIGS. 3B and 3C show that, when the sliding assembly 28c is in the first position, the front end 34 of DAE 18b$_2$ and back end 36 of DAE 18a$_2$ are separated by a distance 30. In one embodiment, this distance is approximately 4", to provide an air gap for the exhaust from cooling devices 24 in the back end 36 of DAE 18c and to provide a gap for routing cables 60 (partially shown in FIG. 3C) to cable carriers 54, which route the cables to the rear of the cabinet, generally indicated at 50 in FIG. 3A. It will be understood that any suitable distance 30 between DAEs may be utilized that enables the DAEs to be configured as described.

When access to either the back end 36 of DAE 18a or the front end 34 of DAE 18b is required, for the purpose of removing and servicing the cooling devices 24 and power supplies 26 of DAE 18a or the disk drives 20 of DAE 18b, the sliding assembly 28 is pulled out from the front of the cabinet, generally indicated at 52 in FIGS. 3A and 3B, to a second, servicing position. FIG. 2 and FIGS. 3A-3C, show sliding assemblies 28 and 28a, respectively, in the second, servicing position. In this position, DAE 18a is completely external from cabinet 12 and DAE 18b is in the approximate position of DAE 18a when sliding assembly 28 is in the first position. FIGS. 3B and 3C show that, when the sliding assembly 28a is in the second position, the front end 34 of DAE 18b$_1$ and back end 36 of DAE 18a$_1$ are separated by a distance 32. In one embodiment, this distance is approximately 12", to provide room between DAE 18a$_1$ and 18b$_1$ for removing cooling devices 24 and power supplies 26 of DAE 18a$_1$, FIG. 4, and for removing disk drives 20 from DAE 18a$_2$, FIG. 5. It will be understood that any suitable distance 32 between DAEs may be utilized that enables access to the components of the DAEs as described.

In one embodiment, sliders 22 operate in a dual-stage configuration, where, in a first stage, when sliding assembly 28 is pulled from the cabinet 12, DAEs 18a and 18b maintain distance 30 between them until DAE 18b occupies the approximate location formerly occupied by DAE 18a in the first position. In a second stage, as sliding assembly 28 is continued to be pulled from cabinet 12, DAE 18b remains in its location and the distance between DAE 18a and DAE 18b is increased to distance 32, thereby placing sliding assembly 28 in the second position.

In another embodiment, sliders 22 are configured such that, as sliding assembly 28 is pulled from the cabinet 12, DAE 18a and DAE 18b are slid at different rates of speed relative to each other and the distance between the DAEs gradually increases from distance 30 to distance 32 as the sliding assembly is pulled from the first position to the second position and DAEs 18a and 18b reach their terminal locations in the second position at substantially the same time.

Figure 4:
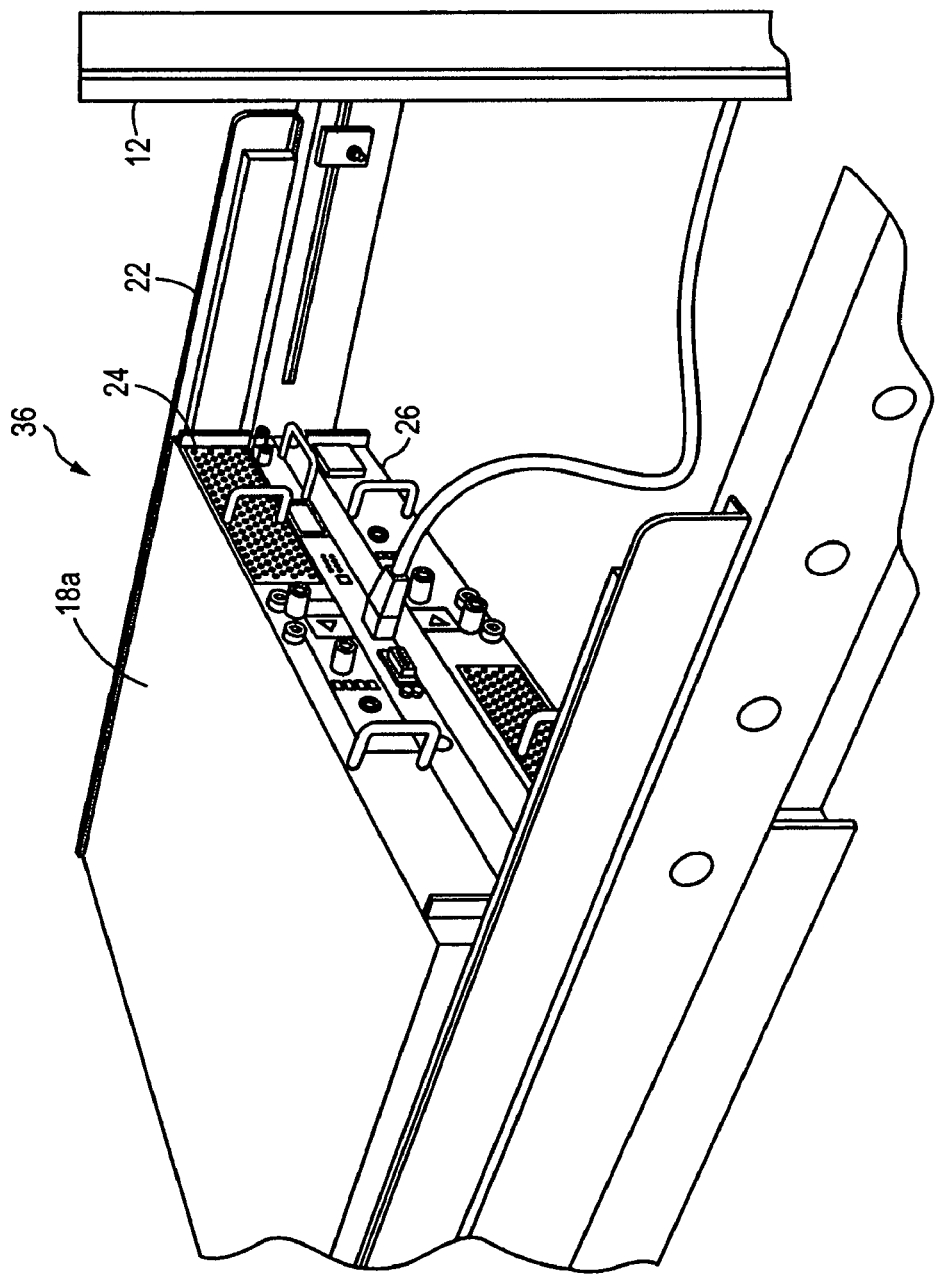
FIG. 4 is a perspective view of a sliding assembly of the storage system.
Figure 5:
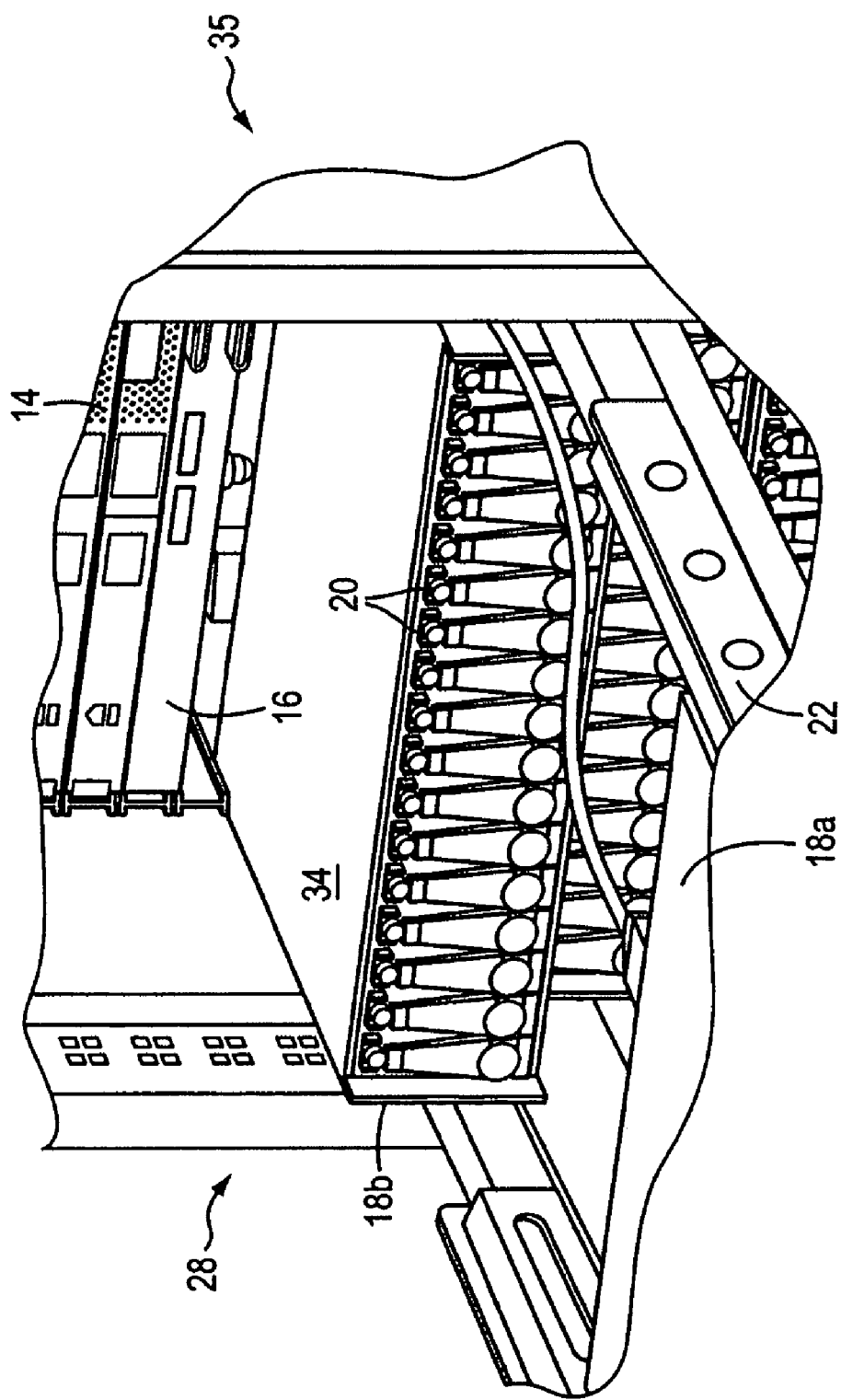
FIG. 5 is another perspective view of the sliding assembly of the storage system.

FIG. 4 shows how access to back end 36 of DAE 18a is available when the sliding assembly 28 is in the second position and FIG. 5 shows how access to the front end 34 of DAE 18b is available when the sliding assembly 28 is in the second position.

When a sliding assembly 28 is in the first position, the drives 20 of DAE 18a are easily accessible through the front of the cabinet 12 and the cooling devices 24 and power supplies 26 of DAE 18b are easily accessible through the rear of cabinet 12 (not shown).

Accordingly, the disclosed a storage system having increased drive density, since DAEs can be mounted in the same space that one DAE occupies in prior art systems. The system provides full access to all of the drives and power supplies of each DAE and allows for hot aisle-cold aisle cooling. The system includes a sliding mount system that enables two DAEs to be mounted in the same space that a single DAE was mounted in the prior art system. The pair of DAEs is mounted within the cabinet via a sliding mechanism that allows the DAEs to be mounted in relatively close proximity to each other when the DAEs are in operation within the cabinet and enables the DAEs to be slide out from the cabinet in a manner that facilitates service access to the disk drives and power supplies of both DAEs. Since the DAEs are mounted within the cabinet in a common orientation, the fans in each DAE are oriented to direct air into the front of the cabinet, through the DAEs and out through the rear of the cabinet, thus facilitating hot aisle-cold-aisle cooling. Further, given the common orientation of the DAEs, all cabling of the system is able to be directed to the rear of the cabinet.

While the figures show a storage system including 3.5" disk drives in a 3 U configuration, it will be understood that any configuration and size of disk drives may be utilized. For example, 2.5" disk drives or 3.5" disk drives in a 2 U configuration may be utilized. Further, a stacked pair of DAEs could take the place of each single DAE described above, such that a total of four DAEs are included in each sliding assembly, i.e., two front DAEs and two rear DAEs.

The system may be embodied in other specific forms without departing from the spirit or essential characteristics thereof. Furthermore, although the system has been described in connection with a data storage system, it will be understood that the system may be utilized for housing electronic components in any type of electronic system. The present embodiments are therefore to be considered in respects as illustrative and not restrictive, the scope thereof being indicated by the appended claims rather than by the foregoing description, and all changes which come within the meaning and range of the equivalency of the claims are therefore intended to be embraced therein.

The invention claimed is:

1. An electronic component housing system comprising:
a cabinet having a front portion and a rear portion;
a sliding mechanism mounted within the cabinet; and
first and second electronic devices mounted to the sliding mechanism, the first and second electronic devices each having a front end and a back end;
the sliding mechanism, in a first mode, enabling the first and second electronic devices mounted thereto to be positioned within the cabinet between the front portion and the rear portion thereof, such that the front end of the first electronic device is disposed proximate the front portion of the cabinet and the back end of the second electronic device is disposed proximate the rear portion of the cabinet; and
the sliding mechanism, in a second mode, enabling the first electronic device to be positioned beyond the front portion of the cabinet and the second electronic device to be positioned in a location substantially similar to the position occupied by the first electronic device in the first mode;
wherein, in the first mode, the back end of the first electronic device is disposed a first distance from the front end of the second electronic device and, in the second mode, the back end of the first electronic device is disposed a second distance from the front end of the second electronic device, the first distance being less than the second distance; and
wherein, in the first mode and the second mode, the first and second electronic devices remain in a coplanar relationship.

2. The system of claim 1 wherein the sliding mechanism includes dual-stage sliders that, in a first sliding stage, move the first and second electronic components from the first mode to a middle mode, wherein the second electronic device is positioned in its second mode position, while maintaining the first distance between the first and second electronic devices, and, in a second sliding stage, move the first electronic component to its second mode position by increasing the distance between the first and second electronic components from the first distance to the second distance.

3. The system of claim 1 where the first and second electronic devices comprise disk array enclosures having a number of disk drives mounted in the front end thereof and a number of power supplies mounted in the back end thereof.

4. The system of claim 3 wherein the each disk array enclosure further includes a fan positioned therein to move air through the front portion of the cabinet and out of the rear portion of the cabinet.

5. The system of claim 1 wherein, in the second mode, access to the back end of the first electronic device and access to the front end of the second electronic device is enabled.

6. The system of claim 3 wherein, in the second mode, access to the power supplies of the first electronic device and access to the disk drives of the second electronic device is enabled.

7. An electronic component housing system comprising:
a cabinet having a front portion and a rear portion;
a sliding mechanism mounted within the cabinet; and
first and second disk array enclosures mounted to the sliding mechanism, the first and second disk array enclosures each having a front end and a back end;
the sliding mechanism, in a first mode, enabling the first and second disk array enclosures mounted thereto to be positioned within the cabinet between the front portion and the rear portion thereof, such that the front end of the first disk array enclosure is disposed proximate the front portion of the cabinet and the back end of the second disk array enclosure is disposed proximate the rear portion of the cabinet; and
the sliding mechanism, in a second mode, enabling the first disk array enclosure to be positioned beyond the front portion of the cabinet and the second disk array enclosure to be positioned in a location substantially similar to the position occupied by the first disk array enclosure in the first mode;
wherein, in the first mode, the back end of the first disk array enclosure is disposed a first distance from the front end of the second disk array enclosures and, in the second mode, the back end of the first disk array enclosure is disposed a second distance from the front end of the second disk array enclosure, the first distance being less than the second distance; and
wherein, in the first mode and the second mode, the first and second disk array enclosures remain in a coplanar relationship.

8. The system of claim 7 wherein the sliding mechanism includes dual-stage sliders that, in a first sliding stage, move the first and second disk array enclosures from the first mode to a middle mode, wherein the second disk array enclosure is positioned in its second mode position, while maintaining the first distance between the first and second disk array enclosures, and, in a second sliding stage, move the first disk array enclosures to its second mode position by increasing the distance between the first and second disk array enclosures from the first distance to the second distance.

9. An electronic component housing system comprising:
a cabinet having a front portion and a rear portion; and first and second electronic components slidably mounted within the cabinet such that the first and second electronic components are substantially mounted in a same plane, with a back end of the first electronic component being proximate a front end of the second electronic component; wherein, in a first mode, the electronic components are stored within the cabinet between the front portion and the rear portion and, in a second mode, are able to be slid out from the cabinet such that a front one of the components is slide beyond the front portion of the cabinet and the rear one of the components is slid to a location substantially similar to the position occupied by the front component in the first mode; wherein, in the first mode, the back end of the first electronic component is disposed a first distance from the front end of the second electronic component and, in the second mode, the back end of the first electronic component is disposed a second distance from the front end of the second electronic component, the first distance being less than the second distance; and wherein, in the first mode and the second mode, the first and second electronic components remain in the same plane.

* * * * *